(12) United States Patent
Koga et al.

(10) Patent No.: US 7,544,049 B2
(45) Date of Patent: Jun. 9, 2009

(54) COOLING DEVICE AND CENTRIFUGAL PUMP TO BE USED IN THE SAME DEVICE

(75) Inventors: Shinya Koga, Fukuoka (JP); Toshisuke Sakai, Fukuoka (JP); Kyou Niwatsukino, Fukuoka (JP); Toshiyuki Kubota, Fukuoka (JP)

(73) Assignee: Panasonic Corporation, Osaka (JP)

( * ) Notice: Subject to any disclaimer, the term of this patent is extended or adjusted under 35 U.S.C. 154(b) by 647 days.

(21) Appl. No.: 10/852,179

(22) Filed: May 25, 2004

(65) Prior Publication Data

US 2004/0240179 A1 Dec. 2, 2004

(30) Foreign Application Priority Data

May 26, 2003 (JP) ............................. 2003-147260

(51) Int. Cl.
*F04B 35/04* (2006.01)
*H05K 7/20* (2006.01)
(52) U.S. Cl. ............. 417/423.8; 417/423.1; 417/423.14; 361/699
(58) Field of Classification Search ............... 361/689, 361/699, 687, 701, 697, 698, 199; 417/423.14, 417/423.1, 423.8
See application file for complete search history.

(56) References Cited

U.S. PATENT DOCUMENTS

| | | | |
|---|---|---|---|
| 5,764,483 A | 6/1998 | Ohashi et al. | |
| 6,019,165 A | 2/2000 | Batchelder | |
| 6,208,512 B1 | 3/2001 | Goldowsky et al. | |
| 6,327,145 B1 | 12/2001 | Lian et al. | |
| 6,351,384 B1 | 2/2002 | Daikoku et al. | |
| 6,408,937 B1 * | 6/2002 | Roy | 165/104.33 |
| 6,829,142 B2 * | 12/2004 | Belady et al. | 361/687 |
| 6,867,973 B2 * | 3/2005 | Chang | 361/699 |
| 7,255,154 B2 | 8/2007 | Koga et al. | |
| 2003/0151130 A1 * | 8/2003 | Cheon | 257/712 |
| 2004/0052048 A1 * | 3/2004 | Wu et al. | 361/699 |
| 2004/0052663 A1 | 3/2004 | Laing et al. | |

(Continued)

FOREIGN PATENT DOCUMENTS

JP 05264139 A 10/1993

(Continued)

*Primary Examiner*—Devon C Kramer
*Assistant Examiner*—Leonard J Weinstein
(74) *Attorney, Agent, or Firm*—Wenderoth, Lind & Ponack, L.L.P.

(57) ABSTRACT

A cooling device has a closed circulating channel for circulating coolant, and in the channel, a radiator and a contact-heat-exchanger type centrifugal pump are provided. A heat-producing electronic component contacts with the centrifugal pump, and the coolant in the pump collects the heat off the component due to the heat exchanging function. Then the heat is dissipated from the radiator. The pump includes a pump-casing made of highly heat conductive material and an impeller. The pump casing has a base wall and a cover wall opposite the base wall. The base wall has an outer wall face constituting a heat-receiving face, and an inner wall face facing the impeller. The impeller is disposed in a pump room defined between the base wall and cover wall of the casing. A sucking channel is provided between the heat-receiving face and an inner wall face of the pump room. This inner wall has a recess where protrusions extending toward the impeller or dimples are provided.

50 Claims, 5 Drawing Sheets

U.S. PATENT DOCUMENTS

2004/0123614 A1* 7/2004 Stewart .................... 62/259.2
2004/0190254 A1* 9/2004 Hu et al. .................... 361/699

FOREIGN PATENT DOCUMENTS

| JP | 7-143615 | 6/1995 |
| JP | 07142886 A | 6/1995 |
| JP | 1 085 217 | 3/2001 |
| WO | 03/098415 | 11/2003 |
| WO | WO03098415 A1 * | 11/2003 |

* cited by examiner

COOLING DEVICE AND CENTRIFUGAL PUMP TO BE USED IN THE SAME DEVICE

TECHNICAL FIELD

The present invention relates to a cooling device which cools heat-producing electronic components, such as a central processing unit (CPU), disposed in a housing by circulating coolant. It also relates to a centrifugal pump to be used in the cooling device.

BACKGROUND ART

A speed enhancement technology has been developed rapidly in the computer industry, so that a clock frequency of a CPU becomes substantially higher than a previous one. As a result, the CPU produces too much heat for a conventional heat sink to air-cool the CPU. Thus a cooling device of high power and high efficiency is vitally required. One of such cooling devices is disclosed in Japanese Patent Application Non-Examined Publication No. H07-142886. This cooling device circulates coolant through a substrate on which heat-producing electronic components are mounted, thereby cooling the substrate.

This conventional cooling device that circulates the coolant for cooling an electronic apparatus is described hereinafter. The electronic apparatus in this description refers to such an apparatus that carries out a process by loading a program to a CPU, in particular, a small size and portable apparatus such as a notebook-size computer. Besides the foregoing apparatus, the conventional cooling device can also cool an apparatus in which electronic components producing heat due to energizing are mounted.

Figure 9:
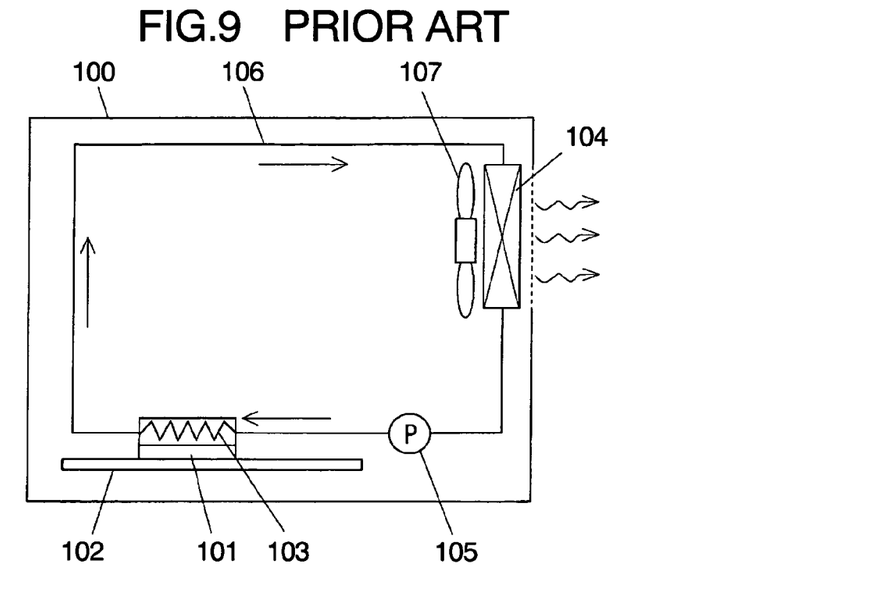
FIG. 9 shows a structure of a first conventional cooling device that cools an electronic apparatus.

A first conventional cooling device has a structure as shown in FIG. 9. Housing 100 accommodates circuit board 102, cooler 103 and radiator 104. Heat-producing electronic component (hereinafter referred to simply as component) 101 is mounted on board 102. Cooler 103 exchanges the heat between component 101 and coolant, thereby cooling component 101. Radiator 104 liberates the heat from the coolant. Pump 105 circulates the coolant through pipe 106, and fan 107 air-cools radiator 104.

An operation of the first conventional cooling device is described hereinafter. Pump 105 discharges the coolant, which then travels through pipe 106 and arrives at cooler 103, where the coolant collects heat off component 101 and its temperature thus rises. The coolant then travels to radiator 104, where fan 107 air-cools forcibly the coolant, so that its temperature lowers. The coolant returned to pump 15, and repeats the foregoing cycle. As discussed above, the coolant circulates through pipe 106, thereby cooling component 101.

Figure 10:
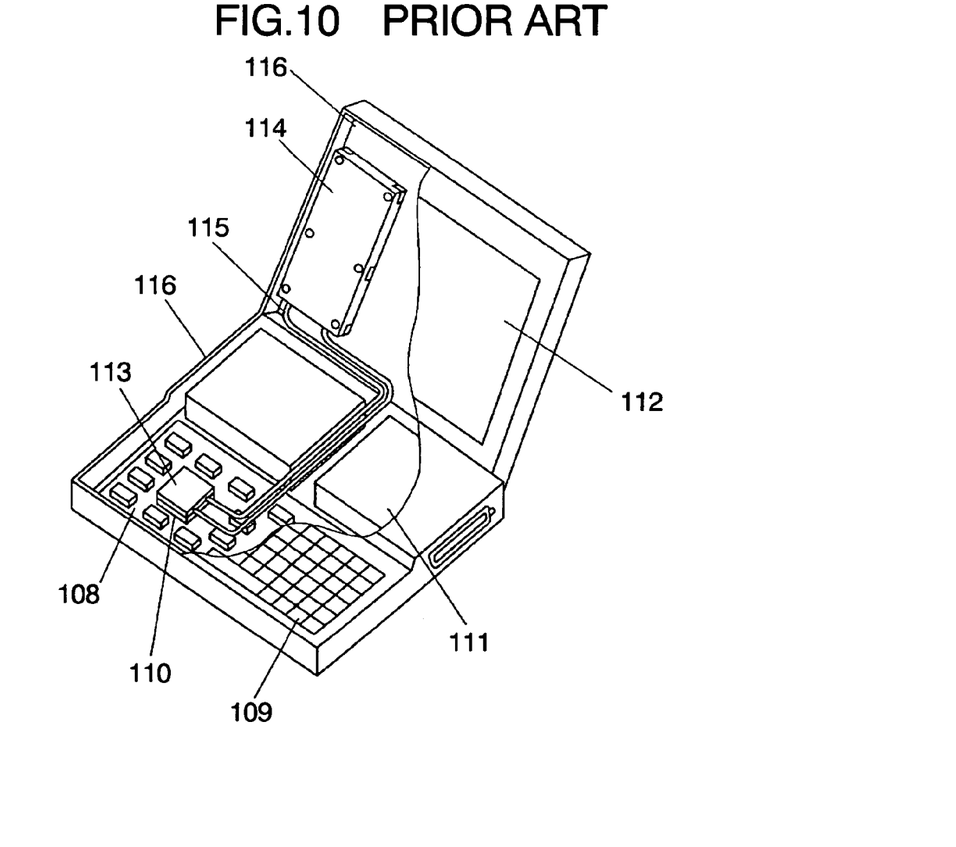
FIG. 10 shows a structure of a second conventional cooling device that cools an electronic apparatus.

The foregoing Non-Examined Publication also discloses a second conventional cooling device of which structure is shown in FIG. 10. When a heat-producing member is mounted in a confined housing, this second cooling device efficiently transfers the heat generated from the heat-producing member to a wall of the metal housing which works as a radiator, thereby cooling the heat-producing member.

An electronic apparatus includes circuit board 108, keyboard 109, heat-producing semiconductor element (hereinafter referred to simply as element) 110, disc device 111 and display device 112 accommodated in metal housing 116. The second cooling device thermally couples heat-producing element 110 to housing 116 with a heat-transport device having a flexible structure. The heat transport device includes a liquid flow channel mounted to element 110, and is formed of heat-receiving header 113, heat-radiating header 114 and flexible tube 115. Flat heat-receiving header 113 exchanges heat with element 110. Heat-radiating header 114 includes the liquid flow channel and contact with a wall of housing 116. Flexible tube 115 couples header 113 to header 114. A liquid driving mechanism integrated in heat-radiating header 114 drives or circulates the liquid that is sealed in the mechanism between heat-receiving header 113 and heat-radiating header 114. This liquid driving mechanism thus couples element 110 to housing 116 with ease regardless of the components arrangement, and transports the heat efficiently using the liquid movement. Since heat-radiating header 114 is thermally coupled to housing 116, which has a high heat conduction rate, the heat diffuses extensively to housing 116.

The first conventional cooling device, however, needs cooler 103, radiator 104, pump 105 and a refilling tank (not shown) for refilling pump 105 with the coolant. Those elements are assembled into the cooling device, so that the device becomes bulky and complicated. As a result, it is difficult to reduce the size of the device and the device becomes expensive. In other words, the first cooling device is basically fit for cooling a large size electronic apparatus, but is not suitable for a recent notebook-size computer which is compact, light-weight, slim, and carried in a variety of postures.

The second cooling device can be used in a notebook-size computer; however, both of heat-receiving header 113 and heat-radiating header 114 are box-shaped and substantially thick, which prevents the notebook-size computer from being slimmed. To be more specific, in the second cooling device, a reciprocating pump (not shown) is prepared in header 114. This pump has a rather narrower width than other pumps and works as the liquid driving mechanism; however, the thickness of header 114 is specified by this pump, so that the overall thickness cannot be reduced. As a result, the notebook-size computer cannot be further slimmed.

In the notebook size computer, it is difficult for heat-receiving header 113 to accommodate the reciprocating pump of the second cooling device. To be more specific, the thickness of the pump on top of the thickness of element 110 increases the height of the computer, and this configuration goes against the trend toward the slimmed-down design. Further, the reciprocating pump produces vibrations and noises, which influence element 110 on which the pump is placed. The vibrations and noises sometimes cause harsh grating noises. This configuration is thus difficult to be realized.

In the second cooling device, heat-radiating header 114 brought into contact with a wall of housing 116 has a limited heat-radiating area, so that it has a low heat conduction efficiency and a limited cooling power. Increasing a heat-radiating area is one of the ideas for boosting the cooling power; however, the larger area lengthens the liquid flow channel, and an amount of circulating coolant increases, which requires a greater power of the built-in reciprocating pump. The greater power of the pump needs, inconsistently, a greater thickness of header 114. Thus, the reciprocating pump can be independently accommodated in housing 116; however, in this case, another space must be prepared for the pump although the notebook-size computer has been ultimately downsized, and the assembly work becomes cumbersome. As discussed above, the second cooling device limits further downsizing of the notebook-size computer. To be more specific, the performance of the CPU will continue to increase, thereby requiring greater cooling power, so that the second conventional cooling device having the foregoing problems will no longer be used.

A conventional pump having a heat exchanger function needs a cooling water channel in the pump for cooling the coolant with the cooling water supplied separately, so that the pump becomes bulky and complicated. The pump also needs a second pump for circulating the cooling water and a second heat exchanger for collecting the heat off the cooling water, so that the cooling system becomes complicated and is difficult to downsize. The pump thus needs a number of components and its assembly work becomes inefficient. The conventional cooling devices thus cannot be expected to have better thermal efficiency or to be less expensive.

SUMMARY OF THE INVENTION

A cooling device of the present invention includes a radiator and a centrifugal pump of contact heat exchanger model, both disposed in a closed circulating channel in which coolant circulates. Heat-producing electronic components are brought into contact with the centrifugal pump, so that the coolant in the pump collects the heat off the electronic components due to its heat exchanger function, and the radiator of the cooling device dissipates the heat. The centrifugal pump includes a pump-casing made of highly heat conductive material and an impeller. The pump casing has a heat-receiving plane formed on a side face along an interior pump room, and a sucking channel prepared between the heat-receiving plane and an inner wall of the pump room. On the inner wall of the pump room, a recess is provided. In this recess, protrusions extending toward the impeller or dimples are provided. According to the present invention, the cooling device of a simple structure, which allows downsizing and slimming-down, is obtainable while its cooling efficiency is improved.

DETAILED DESCRIPTION OF THE INVENTION

Figure 1:
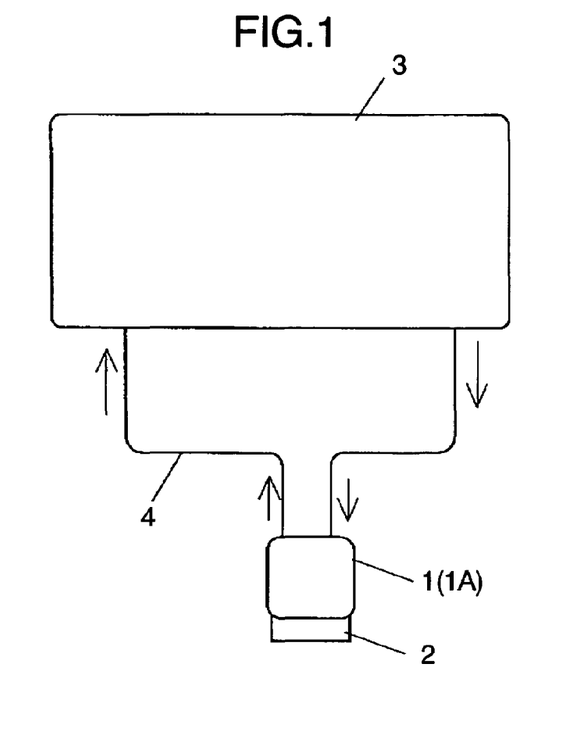
FIG. 1 shows a structure of a cooling device in accordance with an exemplary embodiment of the present invention.
Figure 2:
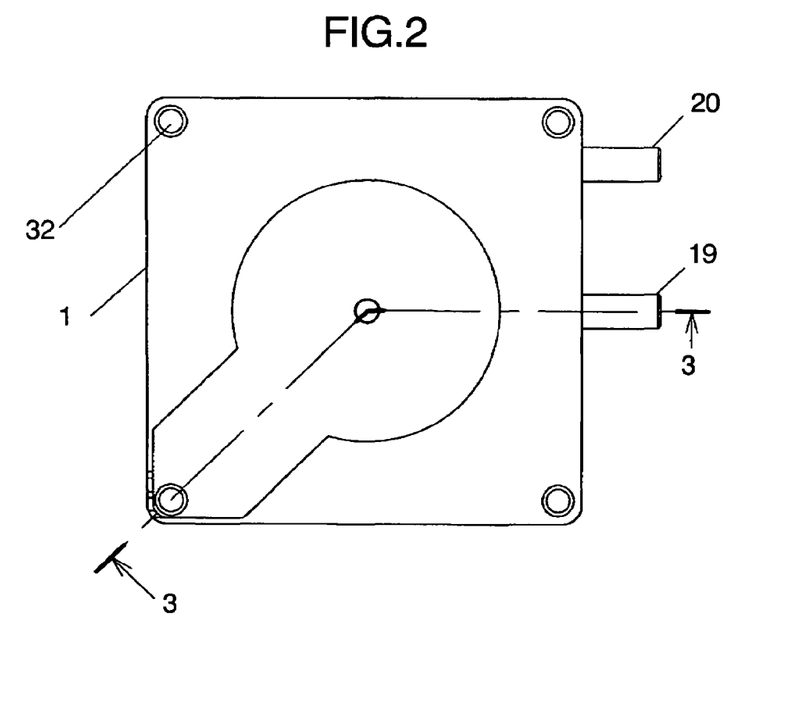
FIG. 2 shows a front view illustrating an appearance of a centrifugal pump of heat-exchanger model, i.e. an element of the cooling device shown in FIG. 1.
Figure 3:
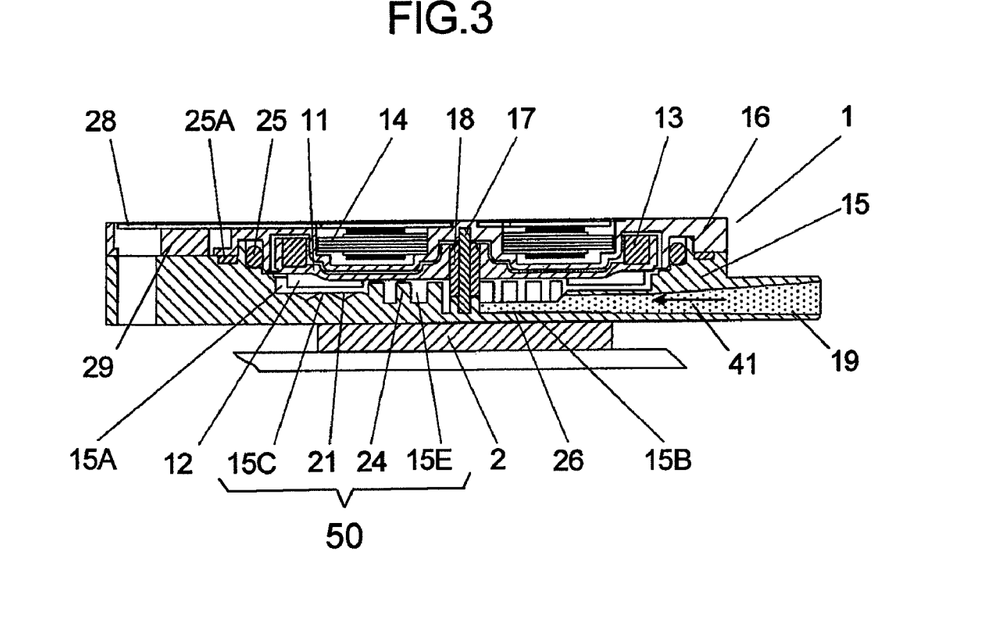
FIG. 3 shows a sectional view of the centrifugal pump of heat-exchanger model shown in FIG. 2.
Figure 4:
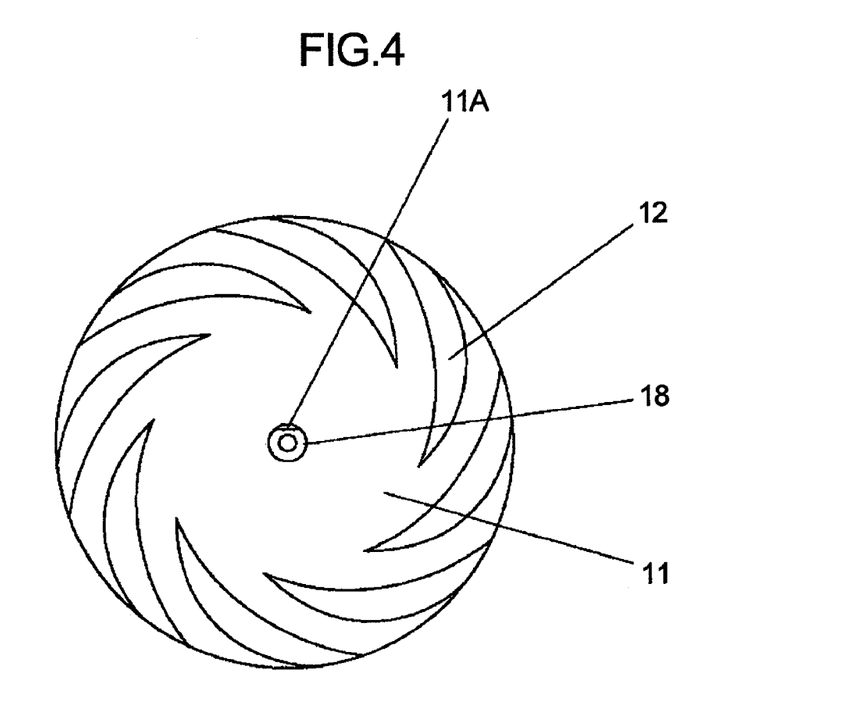
FIG. 4 shows a front view of an impeller of the centrifugal pump shown in FIG. 2.
Figure 5:
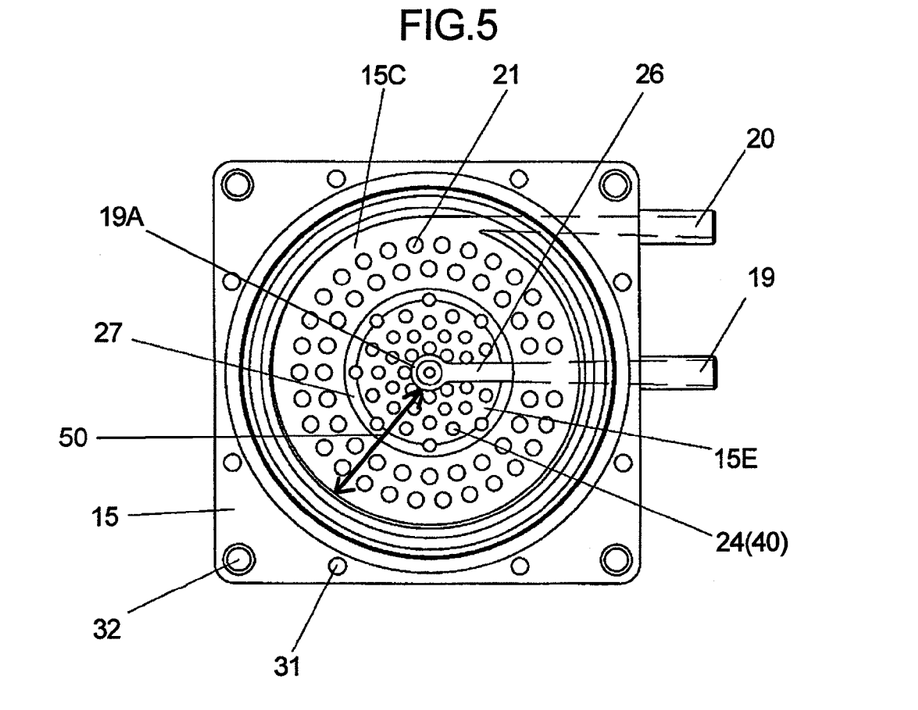
FIG. 5 shows an appearance of a wall of a pump room disposed in the centrifugal pump shown in FIG. 2.

FIG. 1 shows a structure of a cooling device in accordance with an exemplary embodiment of the present invention, FIG. 2 shows a front view illustrating an appearance of a centrifugal pump of heat-exchanger model, i.e. an element of the cooling device. FIG. 3 shows a sectional view of the centrifugal pump of heat-exchanger model taken out along line 3-3 in FIG. 2. FIG. 4 shows a front view of an impeller of the centrifugal pump shown in FIG. 2, and FIG. 5 shows an appearance of an inner wall of a pump room.

Centrifugal pump 1 of heat exchanger model (hereinafter referred to simply as pump 1) is an element of the cooling device. Heat-producing component 2 (hereinafter referred to simply as component) such as a CPU is, in general, a chip component having a flat surface. Pump 1 and component 2 are extremely small and mounted in a compact portable electronic apparatus such as a notebook-size computer. Radiator 3 radiates the heat collected from component 2 by coolant 41 to the outside. Closed circulating channel 4 couples pump 1 to radiator 3, thereby circulating coolant 41, which is liquid and preferably a water solution of propylene glycol which is harmless and used as a food additive. In the case of using aluminum or copper as a material of the casing, an anti-corrosion additive is preferably added in order to increase resistance to corrosion caused by those materials.

Radiator 3 is formed of material having a high heat conductivity and an excellent heat dissipating property, such as a thin plate of copper or aluminum. A coolant path and a reserve tank are formed in radiator 3. A fan can be prepared for forcibly air-cooling radiator 3 so that a better cooling effect can be expected. Circulating channel 4 is formed of flexible rubber having a low gas-permeability, such as butyl rubber tubing because this material allows a flexible piping layout as well as preventing bubbles from entering into the tube.

Next, an interior structure of pump 1 is described. Open impeller 11 has through hole 11A and open blades 12. Ring magnet 13 is inserted into impeller 11. Stator 14 is disposed inside ring-magnet 13. Pump casing 15 forms pump room 15A which accommodates impeller 11 while casing 15 restores kinetic energy, which impeller 11 has given to coolant 41, by a pressure recovery method and guides the energy to a discharge port. Pump room 15A restores kinetic energy, which blades 12 have given to supplied coolant 41, by the pressure recovery method and guides the energy to the discharge port.

Heat-receiving plane 15B is formed on an outer wall face of a base wall of casing 15 along pump room 15A, and brought into contact with component 2, thereby collecting heat off component 2. Heat-receiving plane 15B is formed on the outer wall face of casing 15 substantially parallel with a revolution surface of impeller 11. On radially outer wall surface 15C of the pump room 15A, a large number of dimples 21 are formed. A recess (recessed area) 15E defines a radially inner wall surface on a bottom of the pump room 15A that faces toward impeller 11, and has a large number of protrusions 24 projected from the radially outer wall surface and toward impeller 11. Recess 15E, slope 27, and radially outer wall surface 15C together define an inner wall face 50 of casing 15. Casing cover (cover wall) 16 accommodates impeller 11, and forms pump room 15A together with casing 15. As shown in FIG. 3, fixed shaft (rotary shaft) 17 is disposed to extend between the cover wall 16 and the base wall of casing 15 rotatively supports impeller 11. Fixed shaft 17 is equipped with bearing 18 provided at the center of impeller 11. Sucking channel 19 sucks coolant 41, and discharging channel 20 discharges coolant 41. Sucking channel 19 is disposed between heat-receiving plane 15B and inner wall face 50.

Sucking groove 26 is provided together with sucking channel 19 unitarily along a direction common to channel 19 and groove 26, and extends toward the rotational center of impeller 11. Sucking groove 26 is formed as a step down from recess 15E and communicates with recess 15E. Sucking groove 26 guides coolant 41 sucked through sucking channel 19 to near the rotational center of impeller 11. Slope 27 gradually goes uphill to radially outer wall surface 15C, which is a sloped step up from recess 15E. O-ring 25 seals the engagement between cover 16 and casing 15, and packing 25A functions similar to O-ring 25.

IC 29 regulates an output voltage applied to the windings of stator 14 and is mounted to control board 28. Screw holes 31 are provided for screwing cover 16 to casing 15. Springs or screws are inserted into fixing holes 32 for bringing pump 1 into contact with component 2, urging pump 1 toward component 2, or fixing pump 1 to component 2.

Cover 16 and casing 15 are assembled into the outer shell of pump 11. Of the cover 16 and the casing 15, at least the casing 15, is formed of material having a high thermal conductivity and an excellent heat dissipating property, e.g. copper or aluminum, of which thermal conductivity is 380-400 W/m·k and ca. 230 W/m·K respectively. It is preferable to use the material having at least the foregoing specific thermal conductivity.

Pump 1 has the following specifications: thickness is 5-50 mm; representative dimension of radial direction is 10-100 mm; flow rate is 0.2-5.0 L/minute; head is 0.2-4 m. More typical values are listed below: thickness along the axial direction of rotation is 7-40 mm; representative dimension of radial direction is 20-50 mm; flow rate is 0.3-3.0 L/minute; head is 0.35-2 m; and rpm is 2500-4000. If the specification of this pump is expressed in terms of specific speed, it can be 30-250 m·m$^3$/minute rpm. This value proves that pump 1 is extraordinarily smaller and slimmer than the conventional pumps.

In pump 1, blades 12 of impeller 11 are disposed facing component 2, and heat-receiving plane 15B is formed to have a surface complementary to the upper surface of component 2, so that pump room 15A receives the heat via heat-receiving plane 15B. FIG. 3 shows that pump 1 is disposed above component 2; however pump 1 can be placed below component 2, or those elements can be laterally placed depending on the placement of component 2.

Stator 14 is press-fitted into cover 16 so that the outer rim of stator 14 faces the inner rim of ring-magnet 13. Cover 16 is placed between stator 14 and ring-magnet 13 as a partition for isolating those two elements, so that stator 14 is completely isolated from coolant 41 flowing through pump room 15A. Ring-magnet 13 is a magnet of which at least one face of its circumference is covered with soft magnetic material shaped like a ring. Impeller 11 can be unitarily formed with ring-magnet 13; however, it is separately formed from magnet 13 in this embodiment. In the case of a unitary design, impeller 11 is made of magnet material and a section thereof facing stator 14 is magnetized. Ring magnet 13 is rotated by the rotary magnetic field of stator 14, thereby rotating impeller 11. Then negative pressure occurs around the center of impeller 11, so that coolant 41 is sucked through sucking channel 19 communicating with impeller 11. Coolant 14 is discharged outside by kinetic momentum due to impeller 11. A discharge port (not shown) is provided to casing 15 at a section facing the outer rim of impeller 11, so that coolant 41 is discharged to circulating channel 4 via discharging channel 20.

Bearing 18 made of resin having abrasion resistance and low friction is press-fitted at the center of impeller 11, and fixed shaft 17 made of stainless steel is prepared inside bearing 18 with its two ends fixed at casing 15 and cover 16. Bearing 18 can be insert-molded with impeller 11 instead of being press-fitted. Fixed shaft 17 can also be insert-molded with cover 15 or press-fitted. As shown in FIG. 4, bearing 18 is provided with a D-cut on its outer wall-face, so that a space is prepared between a press-fit hole (not shown) of impeller 11 and bearing 18 per se. As a result, pump room 15A communicates with the backside of impeller 11. This space is used as through hole 11A deviated from the rotation center. Through hole 11A guides parts of coolant 41 pushed out due to the centrifugal force of impeller 11 to the backside of impeller 11, then the parts of coolant 41 pass through hole 11A and flow out to sucking inlet 19A of impeller 11 with negative pressure. In other words, the parts of coolant 41 flow back. Coolant 41 flowing back is mixed at sucking inlet 19A, so that flow-back coolant 41 is always replaced with another flow-back and never stays at one place.

Impeller 11 receives negative pressure around its center due to the centrifugal force of itself, so that cavitation tends to occur there. However, since pump 1 has specific speed of 30-250 m·m$^3$/minute·rpm, the cavitation hardly occurs, and even if it occurs, it is mixed by the foregoing flow-back and discharged. The cavitation possibly generated will not stay around the center of impeller 11 because coolant 41 circulates so as to replace itself with incoming coolant at the backside of impeller 11 and sucking inlet 19A. If air is mixed somewhere in the cooling device, and if the air is sucked into pump 1, the bubbles will not stay around the center of impeller 11 due to the circulation, and the bubbles are discharged gradually. Therefore, there is little noise caused by the cavitation, and no gas space is formed, so that the flow becomes turbulent, which increases an amount of heat transferred.

In pump 1, recess 15E is provided around the center of inner wall face 50 of the pump room of casing 15, and cylindrical protrusions (surface-area-increasing parts) 24 extend from the bottom face of recess 15E toward impeller 11. This structure reduces the overall thickness of pump 1 by the depth of recess 15E, so that the heat transferred from the electronic component to casing 15 can be collected by coolant 41 with ease. As discussed above, the thickness of pump 1 is reduced as much as possible while the performance of pump 1 is maintained, so that a high heat-collecting efficiency is achieved.

In this embodiment, blades 12 are disposed radially outside the area having protrusions 24 instead of being disposed within the area, so that impeller 11 is placed nearer to casing 15. This structure reduces the overall thickness of the pump, and yet, the height of protrusions 24 becomes greater. If the thickness of the pump can increase in some degree, blades 12 can be provided within the area of protrusions 24, i.e. above protrusions 24.

Sucking channel 19 does not have a hole-shape all the way to the center of impeller 11, but its upper thickness is removed to form sucking groove 26, so that recess 15E and protrusions 24 can be formed. This structure allows pump 1 to reduce its overall size while its performance is maintained.

Further, as shown in FIG. 3, a number of dimples 21 are formed on at least a part of a section, where impeller 11 slides, of radially outer wall surface 15C (backside of heat-receiving plane 15B). In this structure, coolant 41 flowing due to the rotation of impeller 11 peels a laminar boundary layer formed on radially outer wall surface 15C, so that coolant 41 flows turbulently. As a result, an amount of heat transferred from heat-receiving plane 15B to coolant 41 becomes greater. The presence of dimples 21 at the sliding section of impeller 12 facilitates peeling of the laminar boundary layer of coolant 41 off radially outer wall surface 15C, so that the amount of the heat transferred from heat-receiving plane 15B to coolant 41 becomes even greater. In this case, the torque necessary for spinning impeller 11 increases a little, so that the placement and the number of dimples should be designed appropriately to the torque tolerance. Radially outer wall surface 15C can undergo a shot peening process or a sand blasting process to form peaks and valleys thereon or roughening itself. Such a process can also increase the heat collecting efficiency based on the same principle though the effect is rather low. Although it is not shown in the accompanying drawings, a spiral groove can be formed on radially outer wall surface 15C for coolant 41 to flow turbulently, so that the amount of heat transferred can be increased.

Slope 27 disposed around recess 15E reduces flow resistance as much as possible when coolant 41 passes from recess 15E to radially outer wall surface 15C stepped-up, in other words, step 27 helps maintain the pump performance.

O-ring 25 is sandwiched in a radial direction between cover 16 and casing 15 when those two elements are engaged with each other, and seals the two elements off from each other. Packing 25A is compressed by cover 16 and casing 15 when those two elements are tightened up together with screws (not shown), thereby sealing the two elements off from each other. Thus pump room 15A is doubly sealed. This structure allows coolant 41 to vaporize in substantially less quantity than in the case of a single seal, and increases the safety against liquid-leakage from the cooling device. O-ring 25 and packing 25A can be unitarily formed of rubber for double sealing.

A temperature of IC 29 rises as high as nearly 100° C. or more during the pump operation; however if IC 29 is mounted such that it is brought into contact with casing 15, the heat of IC 29 is collected by casing 15. In other words, pump 1 also collects the heat off IC 29, thereby lowering the temperature of IC 29 during the operation. As a result, IC 29 works always steadily. Further, this structure allows IC 29 to extend its life because IC 29 prolongs its service life at a lower temperature. FIG. 3 shows that board 28 is placed such that IC 29 is directly contact with casing 15. However, a free-face of board 28 (the face where electronic components such as IC 29 are not mounted, i.e. the face behind the face having IC 29) can be brought into contact with casing 15 for dissipating the heat of IC 29.

Next, an operation of pump 1 is demonstrated hereinafter. IC 29 and board 28 apply a control voltage to the windings of stator 14, thereby generating rotary magnetic field in stator 14. The rotary magnetic field spins ring-magnet 13, namely, impeller 11.

Magnetic flux flows from ring-magnet 13 toward stator 14; however some flux leaks in other directions, so that the rotation of impeller 11 extends the shifting magnetic field leaked from ring-magnet 13 to metal casing 15 (conductive material), and an eddy current occurs in casing 15. This eddy current makes resistance against the rotation of ring-magnet 13. Thus if the minimum distance between ring-magnet 13 and casing 15 can be kept at not less than 2 mm in every direction, the resistance can be substantially reduced. In the case of disposing stator 14 within ring-magnet 13 in a radius direction, ring-magnet 13 is magnetized to produce magnetic force inward in the radius direction. This preparation allows the leakage magnetic field to occur mainly at the outside as far as within the height in an axial direction of ring-magnet 13. Thus if metal casing 15 (conductive material) is placed at a distance not less than 2 mm from ring-magnet 13 and in the same level as the height of ring-magnet 13 in the axial direction, the resistance against the rotation of ring-magnet 13 can be substantially reduced. In other words, the outer rim of ring-magnet 13 is preferably off casing 15 by not less than 2 mm along the radius direction of the rotating axis of impeller 11. If a yoke is further provided at the outer rim of ring-magnet 13, the leakage magnetic field can be almost prevented. If ring-magnet 13 tapers inward and is magnetized at its inner rim, and both of ring-magnet 13 and stator 14 are placed in the radial direction, the resistance against the rotation caused by the eddy current due to the shifting magnetic field can be reduced.

Coolant 41 is sucked through sucking channel 19 by spinning blades 12, and discharged from discharging channel 20. During this operation, in pump room 15A, coolant 41 sucked from channel 19 is transported to recess 15E of casing 15 and further flows along sucking groove 26 to near the rotation center of impeller 11. Then coolant 41 hits against bearing 18 to diffuse in every direction, and hits a number of protrusions 24 before entering between blades 12. On the other hand, the heat generated from component 2 travels to casing 15 and is transferred to protrusions 24 projected from recess 15E, so that coolant 41 collects the heat when it hits against protrusions 24. The flow of coolant 41 through spaces between protrusions 24 produces eddies, which peel thermal boundary layers off protrusions 24. In other words, coolant 41 peels liquid film clung to protrusions 24 off, thereby collecting the heat off protrusions 24. Instead of protrusions 24, dimples 40 can be provided on the bottom face of recess 15E. This preparation also peels the thermal boundary layer and can collect the heat off casing 15 with ease.

The heat transferred from component 2 to casing 15 travels everywhere on radially outer wall surface 15C. On the other hand, the laminar boundary layer, which is formed when coolant 41 passes through pump room 15A in such a manner as the layer clings to radially outer wall surface 15C, is peeled off by dimples 21 and impeller 11 or blades 12 sliding there. In other words, the layer which stores the heat transferred to casing 15, namely, the thermal boundary layer, is peeled off. As a result, much more heat transferred to casing 15 can be collected by coolant 41. As discussed above, the heat generated from component 2, i.e. the heat stored in protrusions 24 and casing 15, is collected by coolant 41, and discharged through discharging channel 20 together with coolant 41 by spinning blades 12. Coolant 41 then flows through circulating channel 4 to radiator 3, which cools coolant 41, and is sucked into pump 1 again with a lower temperature. This circulation is repeated, thereby cooling component 2.

As described above, pump 1 includes casing 15 made from material having a high thermal conductivity, and open impeller 11 having blades 12. Inner wall face 15C has recess 15E, and protrusions 24 extend from the bottom face of recess 15E toward impeller 11. This structure allows reducing the thickness of pump 1 and increasing the surface area of interior wall of the pump room, so that a heat collecting efficiency increases. The shape of heat-receiving plane 15B and the shape of an upper surface of component 2 complement each other three-dimensionally, so that sucking channel 19 does not extend over component 2. This structure allows heat-receiving plane 15B and the upper surface of component 2 to solidly contact with each other, so that the heat can be transferred efficiently.

Figure 6:
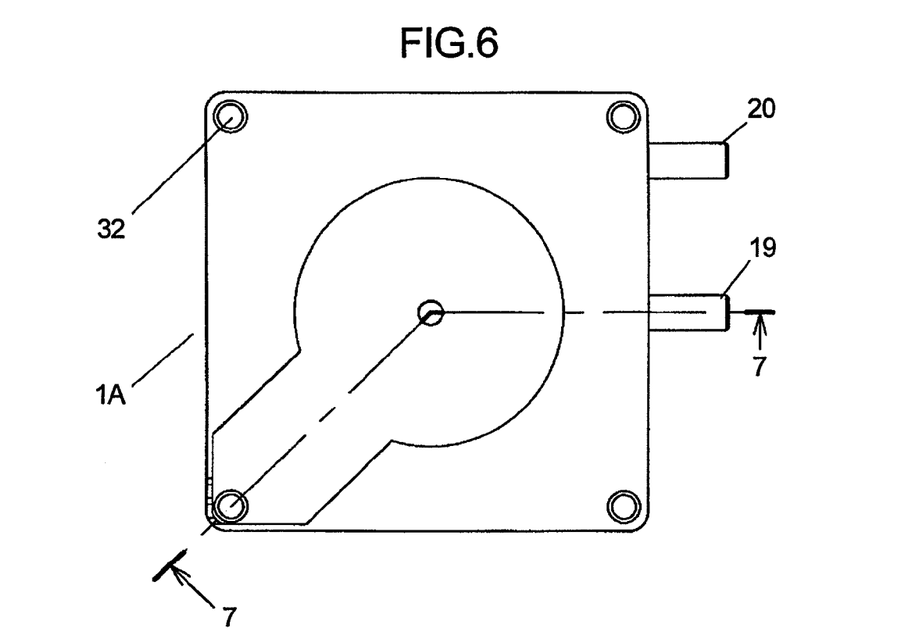
FIG. 6 shows a front view illustrating an appearance of another centrifugal pump of heat exchanger model, an element of the cooling device in accordance with the exemplary embodiment of the present invention.
Figure 7:
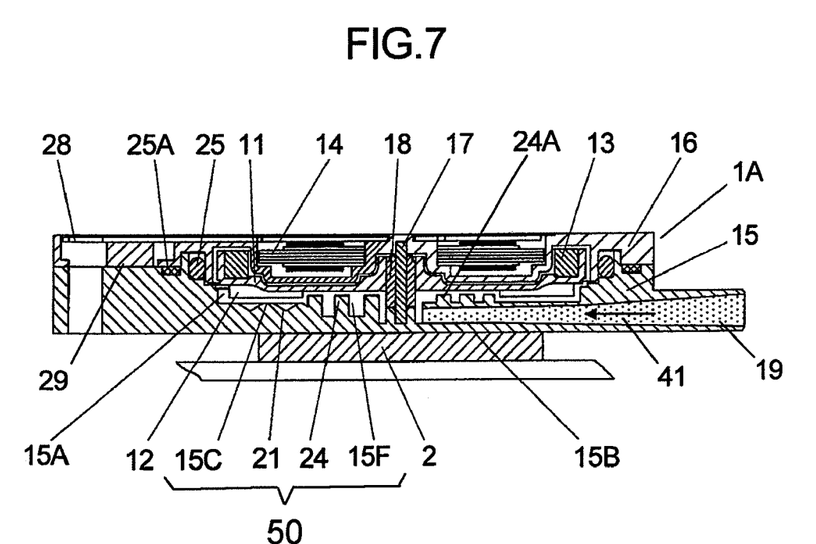
FIG. 7 shows a sectional view of the centrifugal pump shown in FIG. 6.
Figure 8:
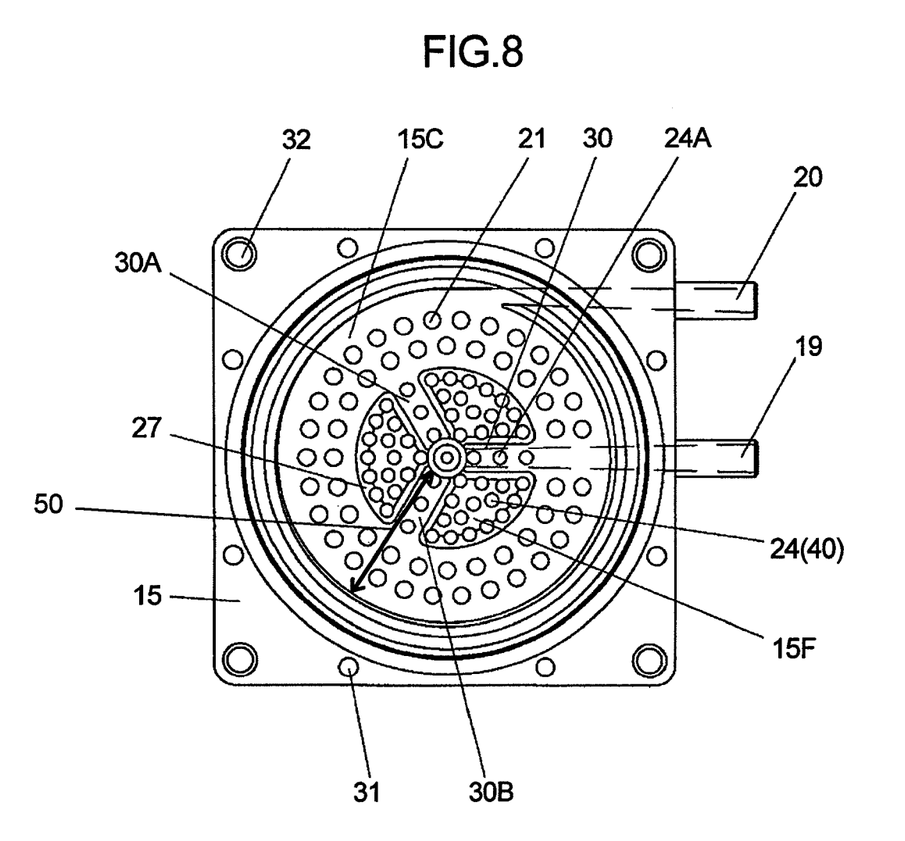
FIG. 8 shows an appearance of an inner wall of an interior pump room in the centrifugal pump shown in FIG. 6.

Next, another structure of the centrifugal pump in accordance with the embodiment is described hereinafter. FIG. 6 shows a front view illustrating an appearance of this another centrifugal pump of heat exchanger model, i.e. an element of the cooling device in accordance with this exemplary embodiment of the present invention. FIG. 7 shows a sectional view of the centrifugal pump taken along line 7-7 in FIG. 6. FIG. 8 shows an appearance of an interior wall of a pump room disposed in the centrifugal pump shown in FIG. 6. Centrifugal pump 1A differs from pump 1 in the following point: A sucking channel delivered from the outside of pump 1A crosses a part of recessed section in the pump room and extends to near the center of the impeller with itself being kept in a tubular form. Similar elements to those of pump 1 shown in FIG. 2-FIG. 5 have the same reference marks, and the descriptions thereof are omitted here.

Recess 15F of the pump room is disposed one step down from radially outer wall surface 15C of casing 15. Cylindrical protrusions 24 extend from a bottom face of recess 15F toward impeller 11. Recess transversal sections 30, 30A, 30B cross recess 15F and extend from sucking channel 19 toward the center of casing 15. Protrusions 24A extend from the upper faces of transverse sections 30, 30A, 30B.

Transverse section 30 has sucking channel 19 therein, and guides channel 19 to near the center of casing 15. The upper face of transverse section 30 has approximately the same height as radially outer wall surface 15C. In other words, sucking channel 19 crosses parts of recess 15F. During the operation of pump 1A, coolant 41 sucked is drawn by impeller 11 and flows on recess 15F to the outside of impeller 11. In this case, transverse section 30 works as resistance against the flow of coolant 41 and floats impeller 11. In order to keep the flotation balance of impeller 11, transverse sections 30A, 30B having a similar shape viewed from pump room 15A to transverse section 30 are provided at the same intervals. This structure allows impeller 11 to rotate free from slanting because impeller 11 receives floating force well balanced. If there is only transverse section 30, impeller 11 tends to rotate slantingly with respect to radially outer wall surface 15C. In this case, fixed shaft 17 and bearing 18 shorten their service lives, or impeller 11 rotates contacting with wall face 15C, so that the performance of the pump lowers, and in the worst case, the pump stops. In this embodiment, three transverse sections 30, 30A, 30B are provided at the same intervals (120 degrees). If they are provided radially from shaft 17 at the same intervals, it is preferable to provide a number of transverse sections.

Transverse sections 30, 30A, 30B have protrusions 24A on their faces toward pump room 15A, and blades 12 are not provided in the area of protrusions 24A. This structure allows increasing the surface area of radially outer wall surface 15C, so that the overall thickness of the pump can be reduced while the heat collecting efficiency increases. In the case of increasing the pump performance instead of the heat collecting performance, protrusions 24A are omitted, and blades 12 can be provided at the places toward the protrusion-omitted places. If a user does not stick to a slim pump, protrusions 24A are provided, and blades 12 are also provided above the protruded area such that blades 12 do not touch protrusions 24A. In this case, both of the heat-collecting performance and the pump performance can increase.

Next, an operation of pump 1A is demonstrated. IC 29 and board 28 apply a control voltage to the windings of stator 14, thereby generating rotary magnetic field in stator 14. The rotary magnetic field spins ring-magnet 13, namely, impeller 11. Coolant 41 is sucked through sucking channel 19 by spinning impeller 11, namely blades 12, and discharged from discharging channel 20. During this operation, in pump room 15A, coolant 41 sucked from channel 19 crosses recess 15F of casing 15 passing through transverse section 30 and further flows to near the center of pump room 15A. Then coolant 41 hits against bearing 18 to diffuse in every direction, and hits a number of protrusions 24 before entering between blades 12. On the other hand, the heat generated from component 2 travels to casing 15 and is transferred to protrusions 24, 24A projected from recess 15F, so that coolant 41 collects the heat when it hits against protrusions 24. The flow of coolant 41 through spaces between protrusions 24 produces eddies, which peel thermal boundary layers off protrusions 24. In other words, coolant 41 peels liquid film clung to protrusions 24 off, thereby collecting the heat off protrusions 24. Instead of protrusions 24, dimples 40 can be provided on the bottom face of recess 15F. This preparation also peels the thermal boundary layer and can collect the heat off casing 15 with ease.

The heat transferred from component 2 to casing 15 travels everywhere on radially outer wall surface 15C. On the other hand, the laminar boundary layer, which is formed when coolant 41 passes through pump room 15A in such a manner as the layer clings to radially outer wall surface 15C, is peeled off by dimples 21 and impeller 11 or blades 12 sliding there. In other words, the layer which stores the heat transferred to casing 15, namely, the thermal boundary layer, is peeled off. As a result, much more heat transferred to casing 15 can be collected by coolant 41. As discussed above, the heat generated from component 2, i.e. the heat stored in protrusions 24 and casing 15, is collected by coolant 41, and discharged through discharging channel 20 together with coolant 41 by spinning blades 12. Coolant 41 then flows through circulating channel 4 to radiator 3, which cools coolant 41, and is sucked into pump 1 again with a lower temperature. This circulation is repeated, thereby cooling component 2.

As described above, pump 1A includes casing 15 made of material having a high thermal conductivity, and open impeller 11 having blades 12. Radially outer wall surface 15C surrounds recess 15F, and protrusions 24 extend from the bottom face of recess 15F toward impeller 11. This structure allows reducing the thickness of the pump and increasing the surface area of interior wall of the pump room, so that a heat collecting efficiency increases. Further, transverse sections 30, 30A and 30B positively guide coolant 41 sucked to near the center of recess 15F. Protrusions 24 thus positively transferred the heat to coolant 41, so that the heat collecting efficiency further increases. The shape of heat-receiving plane 15B and the shape of an upper surface of component 2 complement each other three-dimensionally, so that sucking channel 19 does not extend over component 2. This structure allows heat-receiving plane 15B and the upper surface of component 2 to solidly contact with each other, so that the heat can be transferred efficiently.

In a closed circulating channel which circulates coolant, a radiator and a centrifugal pump of contact heat-exchanger model are provided. A heat-producing electronic component is brought into contact with the centrifugal pump, and the coolant in the pump collects the heat off the electronic component due to the heat exchanging function. Then the heat is dissipated from the radiator. A cooling device is thus obtainable. The centrifugal pump includes a pump-casing and an impeller both made of highly heat conductive material. In the pump casing, a heat-receiving plane is formed on a side face along a pump room disposed in the casing, and a sucking channel is prepared between the heat-receiving plane and an inner wall of the pump room. On the inner wall of the pump room, a recess is provided. In this recess, protrusions extending toward the impeller, or dimples are provided. The cooling device as structured above has a simple structure and can be downsized and slimmed while its cooling efficiency is improved.

What is claim is:
1. A centrifugal pump comprising:
    a pump casing made of thermally conductive material and having a pump room defined therein, said pump casing including a casing base wall;
    an impeller rotatably mounted in said pump room for rotation about a rotary axis extending in a thickness direction of said pump casing;
    wherein said casing base wall has an inner wall face facing said impeller in the thickness direction;

wherein said casing base wall has an outer wall face opposite said inner wall face, said outer wall face being provided in a heat receiving plane and configured to receive heat from a component;

wherein said inner wall face includes a radially inner surface and a radially outer surface, said radially outer surface being disposed outwardly of said radially inner surface with respect to said rotary axis;

wherein said radially inner surface and said radially outer surface are disposed at different levels in the thickness direction so as to be at different distances from said impeller;

wherein said inner and outer surfaces both face an interior of said pump room, and said radially inner surface constitutes a recessed area that is recessed, relative to said radially outer surface away from said impeller;

wherein said inner wall face further includes a step portion formed between said radially inner surface and said radially outer surface;

wherein a surface-area-increasing part is formed in said recessed area so as to project in the thickness direction toward said impeller from said radially inner surface;

wherein said pump casing further includes a peripheral side wall having an inwardly facing surface that defines an outer boundary of said pump room;

wherein said radially outer surface has an outer periphery defined by said inwardly facing surface of said peripheral side wall of said pump casing, and said radially outer surface extends continuously from said outer periphery thereof to said step portion; and said radially outer surface of said inner wall face of said base wall of said pump casing constitutes a surrounding area that surrounds said recessed area and is disposed closer to said impeller than said recessed area, and said step portion of said inner wall face constitutes a sloped portion as a transition between said recessed area and said surrounding area, said sloped portion gradually sloping from said recessed area toward said impeller.

2. The centrifugal pump of claim 1, wherein
said recessed area includes a recessed surface having a portion thereof that is open toward said impeller.

3. The centrifugal pump of claim 1, wherein
said surface-area-increasing part comprises a protrusion protruding toward said impeller from said recessed area of said inner wall face.

4. The centrifugal pump of claim 3, wherein
said protrusion is one of a plurality of protrusions protruding toward said impeller from said recessed area of said inner wall face.

5. The centrifugal pump of claim 1, wherein
at least one dimple is provided on said inner wall face outside said recessed area, said at least one dimple facing toward said impeller.

6. The centrifugal pump of claim 1, wherein
a sucking channel is disposed, in said thickness direction of said pump casing, between said heat receiving plane and an inner wall face plane in which said inner wall face extends, for sucking coolant into said pump room.

7. The centrifugal pump of claim 6, wherein
said sucking channel extends into said pump room toward said recessed area to communicate with said recessed area and allow coolant to be sucked into said recessed area via said sucking channel.

8. The centrifugal pump of claim 7, wherein
said sucking channel crosses part of said recessed area.

9. The centrifugal pump of claim 6, wherein
said sucking channel extends into said pump room toward the rotary axis of said impeller to communicate with said recessed area and allow coolant to be sucked into said recessed area via said sucking channel.

10. The centrifugal pump of claim 9, wherein
said sucking channel crosses part of said recessed area.

11. The centrifugal pump of claim 9, wherein
a groove is formed in said recessed area in a direction extending along said sucking channel.

12. The centrifugal pump of claim 1, wherein
said impeller includes a ring-shaped magnet, and at least one face of a circumference of said magnet is covered with ring-shaped soft magnetic material.

13. The centrifugal pump of claim 12, wherein
said centrifugal pump further includes a stator facing said magnet and being wound with a winding, and a circuit board having an IC for controlling power to said winding, wherein said circuit board is mounted to said pump casing such that said circuit board is in contact with said pump casing.

14. The centrifugal pump of claim 12, wherein
said centrifugal pump further includes a stator facing the magnet and being wound with a winding, and an IC for controlling power to said winding, wherein said IC is mounted such that said IC is in contact with said pump casing.

15. The centrifugal pump of claim 1, wherein
said impeller includes a ring-shaped magnet spaced from said pump casing by at least 2 mm in every direction.

16. The centrifugal pump of claim 15, wherein
said centrifugal pump further includes a stator facing said magnet and being wound with a winding, and a circuit board having an IC for controlling power to said winding, wherein said circuit board is mounted to said pump casing such that said circuit board is in contact with said pump casing.

17. The centrifugal pump of claim 15, wherein
said centrifugal pump further includes a stator facing the magnet and being wound with a winding, and an IC for controlling power to said winding, wherein said IC is mounted such that said IC is in contact with said pump casing.

18. The centrifugal pump of claim 1, wherein
said impeller includes a ring-shaped magnet having an outer rim spaced from said pump casing by at least 2 mm in a radial direction.

19. The centrifugal pump of claim 18, wherein
said centrifugal pump further includes a stator facing said magnet and being wound with a winding, and a circuit board having an IC for controlling power to said winding, wherein said circuit board is mounted to said pump casing such that said circuit board is in contact with said pump casing.

20. The centrifugal pump of claim 18, wherein
said centrifugal pump further includes a stator facing the magnet and being wound with a winding, and an IC for controlling power to said winding, wherein said IC is mounted such that said IC is in contact with said pump casing.

21. The centrifugal pump of claim 1, wherein
said outer wall face of said base wall of said pump casing has a shape configured to be complementary with a three-dimensional shape of a surface of the component so that said outer wall face and the component can contact each other complementarily to facilitate heat transfer from the component to said base wall of said pump casing.

22. The centrifugal pump of claim 1, wherein
said pump casing further includes a casing cover wall disposed opposite said casing base wall, said pump room being defined between said casing base wall and said casing cover wall.

23. The centrifugal pump of claim 1, wherein
said impeller has an impeller blade; and
said impeller blade of said impeller is not disposed in the immediate space opposite said inner surface of said inner wall face in said thickness direction.

24. The centrifugal pump of claim 23, wherein
said outer surface is annular and is disposed radially outwardly of said radially inner surface; and
each of said radially inner surface and said outer surface extends circumferentially and radially.

25. The centrifugal pump of claim 1, wherein
said outer surface is annular and is disposed radially outwardly of said radially inner surface; and
each of said radially inner surface and said outer surface extends circumferentially and radially.

26. A cooling device including:
a centrifugal pump comprising
a pump casing made of thermally conductive material and having a pump room defined therein, said casing including a casing base wall,
an impeller rotatably mounted in said pump room for rotation about a rotary axis extending in a thickness direction of said pump casing,
wherein said casing base wall has an inner wall face facing said impeller in the thickness direction,
wherein said casing base wall has an outer wall face opposite said inner wall face, said outer wall face being provided in a heat receiving plane and configured to receive heat from a heat-producing electronic component,
wherein said inner wall face includes a radially inner surface and a radially outer surface, said radially outer surface being disposed outwardly of said radially inner surface with respect to said rotary axis,
wherein said radially inner surface and said radially outer surface are disposed at different levels in the thickness direction so as to be at different distances from said impeller,
wherein said inner and radially outer surfaces both face an interior of said pump room, and said radially inner surface constitutes a recessed area that is recessed, relative to said outer surface away from said impeller,
wherein said inner wall face further includes a step portion formed between said radially inner surface and said radially outer surface,
wherein a surface-area-increasing part is formed in said recessed area so as to project in the thickness direction toward said impeller from said radially inner surface,
wherein said pump casing further includes a peripheral side wall having an inwardly facing surface that defines an outer boundary of said pump room,
wherein said radially outer surface has an outer periphery defined by said inwardly facing surface of said peripheral side wall of said pump casing, and said radially outer surface extends continuously from said outer periphery thereof to said step portion, and
wherein said radially outer surface of said inner wall face of said base wall of said pump casing constitutes a surrounding area that surrounds said recessed area and is disposed closer to said impeller than said recessed area, and said step portion of said inner wall face constitutes a sloped portion as a transition between said recessed area and said surrounding area, said sloped portion gradually sloping from said recessed area toward said impeller;
a radiator; and
a closed circulating channel fluidically coupling said pump room with said radiator to circulate coolant through said pump room and said radiator so that heat produced by the electronic component, when the electronic component is contacted with said outer wall face of said base wall of said pump casing, is transferred to said coolant and then from said coolant to said radiator so that the heat can be dissipated by said radiator.

27. The cooling device of claim 26, wherein
said recessed area includes a recessed surface having a portion thereof that is open toward said impeller.

28. The cooling device of claim 26, wherein
said surface-area-increasing part comprises a protrusion protruding toward said impeller from said recessed area of said inner wall face.

29. The cooling device of claim 28, wherein
said protrusion is one of a plurality of protrusions protruding toward said impeller from said recessed area of said inner wall face.

30. The cooling device of claim 26, wherein
at least one dimple is provided on said inner wall face outside said recessed area, said at least one dimple facing toward said impeller.

31. The cooling device of claim 26, wherein
a sucking channel is disposed, in said thickness direction of said pump casing, between said heat receiving plane and an inner wall face plane in which said inner wall face extends, for sucking coolant into said pump room.

32. The cooling device of claim 31, wherein
said sucking channel extends into said pump room toward said recessed area to communicate with said recessed area and allow coolant to be sucked into said recessed area via said sucking channel.

33. The cooling device of claim 32, wherein
said sucking channel crosses part of said recessed area.

34. The cooling device of claim 31, wherein
said sucking channel extends into said pump room toward the rotary axis of said impeller to communicate with said recessed area and allow coolant to be sucked into said recessed area via said sucking channel.

35. The cooling device of claim 34, wherein
said sucking channel crosses part of said recessed area.

36. The cooling device of claim 34, wherein
a groove is formed in said recessed area in a direction extending along said sucking channel.

37. The cooling device of claim 26, wherein
said impeller includes a ring-shaped magnet, and at least one face of a circumference of said magnet is covered with ring-shaped soft magnetic material.

38. The cooling device of claim 37, wherein
said centrifugal pump further includes a stator facing said magnet and being wound with a winding, and a circuit board having an IC for controlling power to said winding, wherein said circuit board is mounted to said pump casing such that said circuit board is in contact with said pump casing.

39. The cooling device of claim 37, wherein
said centrifugal pump further includes a stator facing the magnet and being wound with a winding, and an IC for controlling power to said winding, wherein said IC is mounted such that said IC is in contact with said pump casing.

40. The cooling device of claim 26, wherein
said impeller includes a ring-shaped magnet spaced from said pump casing by at least 2 mm in every direction.

41. The cooling device of claim 40, wherein
said centrifugal pump further includes a stator facing said magnet and being wound with a winding, and a circuit board having an IC for controlling power to said winding, wherein said circuit board is mounted to said pump casing such that said circuit board is in contact with said pump casing.

42. The cooling device of claim 40, wherein
said centrifugal pump further includes a stator facing the magnet and being wound with a winding, and an IC for controlling power to said winding, wherein said IC is mounted such that said IC is in contact with said pump casing.

43. The cooling device of claim 26, wherein
said impeller includes a ring-shaped magnet having an outer rim spaced from said pump casing by at least 2 mm in a radial direction.

44. The cooling device of claim 43, wherein
said centrifugal pump further includes a stator facing said magnet and being wound with a winding, and a circuit board having an IC for controlling power to said winding, wherein said circuit board is mounted to said pump casing such that said circuit board is in contact with said pump casing.

45. The cooling device of claim 43, wherein
said centrifugal pump further includes a stator facing the magnet and being wound with a winding, and an IC for controlling power to said winding, wherein said IC is mounted such that said IC is in contact with said pump casing.

46. The cooling device of claim 26, wherein
said outer wall face of said base wall of said pump casing has a shape configured to be complementary with a three-dimensional shape of a surface of the component so that said outer wall face and the component can contact each other complementarily to facilitate heat transfer from the component to said base wall of said pump casing.

47. The cooling device of claim 26, wherein
said pump casing further includes a casing cover wall disposed opposite said casing base wall, said pump room being defined between said casing base wall and said casing cover wall.

48. The cooling device of claim 26, wherein
said impeller has an impeller blade; and
said impeller blade of said impeller is not disposed in the immediate space opposite said inner surface of said inner wall face in said thickness direction.

49. The cooling device of claim 48, wherein
said outer surface is annular and is disposed radially outwardly of said radially inner surface; and
each of said radially inner surface and said outer surface extends circumferentially and radially.

50. The cooling device of claim 26, wherein
said outer surface is annular and is disposed radially outwardly of said radially inner surface; and
each of said radially inner surface and said outer surface extends circumferentially and radially.

\* \* \* \* \*

UNITED STATES PATENT AND TRADEMARK OFFICE
CERTIFICATE OF CORRECTION

| | | |
|---|---|---|
| PATENT NO. | : 7,544,049 B2 | |
| APPLICATION NO. | : 10/852179 | |
| DATED | : June 9, 2009 | |
| INVENTOR(S) | : Shinya Koga et al. | |

It is certified that error appears in the above-identified patent and that said Letters Patent is hereby corrected as shown below:

In the Claims:

(column 11, line 13), after "wherein said" insert --radially--;

(column 11, lines 26-30), please indent the paragraph (in the same manner as the other paragraphs of claim 1);

(column 11, line 51), after "is provided on" insert --said radially outer surface of--;

(column 13, line 12), after "opposite said" insert --radially--;

(column 13, line 15), after "said" insert --radially--;

(column 13, line 17), after "and said" insert --radially--;

(column 13, line 20), after "said" insert --radially--;

(column 13, line 22), after "and said" insert --radially--;

(column 13, line 47), after "wherein said" insert --radially--; before "outer surfaces" delete "radially";

(column 13, line 50), after "to said" insert --radially--;

(column 14, line 28), after "is provided on" insert --said radially outer surface of--;

(column 16, line 20), after "opposite said" insert --radially--;

(column 16, line 23), after "said" insert --radially--;

(column 16, line 25), after "and said" insert --radially--;

(column 16, line 28), after "said" insert --radially--; and

UNITED STATES PATENT AND TRADEMARK OFFICE
CERTIFICATE OF CORRECTION

PATENT NO. : 7,544,049 B2
APPLICATION NO. : 10/852179
DATED : June 9, 2009
INVENTOR(S) : Shinya Koga et al.

It is certified that error appears in the above-identified patent and that said Letters Patent is hereby corrected as shown below:

(column 16, line 30), after "and said" insert --radially--.

Signed and Sealed this

Fifteenth Day of September, 2009

David J. Kappos
*Director of the United States Patent and Trademark Office*